(12) United States Patent
Kim et al.

(10) Patent No.: US 8,928,107 B2
(45) Date of Patent: Jan. 6, 2015

(54) LIGHT DETECTION DEVICES AND METHODS OF MANUFACTURING THE SAME

(75) Inventors: Sang Hoon Kim, Bucheon-si (KR); Gyungock Kim, Daejeon (KR); In Gyoo Kim, Daejeon (KR); JiHo Joo, Goyang-si (KR); Ki Seok Jang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 70 days.

(21) Appl. No.: 13/284,818

(22) Filed: Oct. 28, 2011

(65) Prior Publication Data

US 2012/0126357 A1    May 24, 2012

(30) Foreign Application Priority Data

Nov. 23, 2010  (KR) .................. 10-2010-0116877

(51) Int. Cl.
*H01L 31/06* (2012.01)
*H01L 31/102* (2006.01)
*H01L 31/18* (2006.01)

(52) U.S. Cl.
CPC ............. *H01L 31/102* (2013.01); *H01L 31/18* (2013.01)
USPC .................... 257/465; 257/461; 257/E31.061

(58) Field of Classification Search
USPC .................... 257/461, 465, E31.061
See application file for complete search history.

(56) References Cited

U.S. PATENT DOCUMENTS

| 6,075,253 | A  | * | 6/2000 | Sugiyama et al. ............... 257/19 |
| 2010/0151619 | A1 | * | 6/2010 | Yasaitis et al. .................. 438/93 |

FOREIGN PATENT DOCUMENTS

| JP | 11-177122 A | 7/1999 |
| WO | WO 04/001857 A1 | 12/2003 |
| WO | WO 2005/083750 A2 | 9/2005 |

OTHER PUBLICATIONS

Hyun-Yong Yu et al., "High-Efficiency p-i-n Photodetectors on Selective-Area-Grown Ge for Monolithic Integration", IEEE Electron Device Letters, 2009, pp. 1161-1163, vol. 30, No. 11.

T. H. Loh et al., "Selective epitaxial germanium on silicon-on-insulator high speed photodetectors using low-temperature ultrathin SiGe buffer", Applied Physics Letters, 2007, pp. 073503-073503-3, vol. 91.

* cited by examiner

*Primary Examiner* — Amar Movva

(57) ABSTRACT

Provided are light detection devices and methods of manufacturing the same. The light detection device includes a first conductive pattern on a surface of a substrate, an insulating pattern on the substrate and having an opening exposing at least a portion of the first conductive pattern, a light absorbing layer filling the opening of the insulating pattern and having a top surface disposed at a level substantially higher than a top surface of the insulating pattern, a second conductive pattern on the light absorbing layer, and connecting terminals electrically connected to the first and second conductive patterns, respectively.

10 Claims, 5 Drawing Sheets

LIGHT DETECTION DEVICES AND METHODS OF MANUFACTURING THE SAME

CROSS-REFERENCE TO RELATED APPLICATIONS

This U.S. non-provisional patent application claims priority under 35 U.S.C. §119 to Korean Patent Application No. 10-2010-0116877, filed on Nov. 23, 2010, the entirety of which is incorporated by reference herein.

BACKGROUND

The present disclosure herein relates to light detection devices and methods of manufacturing the same and, more particularly, to light detection devices of vertical incidence type and methods of manufacturing the same.

An optical communication using light as a medium for exchanging information and image sensors converting light reflected from an object into an electrical signal have been increasingly developed. Light receiving devices converting light into an electrical signal are very attractive in various technical fields such as the optical communication and the image sensors, etc. A light detector converting a signal using light as a medium into an electrical signal may be formed by semiconductor, and semiconductor materials of different kinds may be used depending on purposes of components in the light detector. An absorbing layer of a light detector formed of semiconductor may receive light to generate electrons and holes. The generated electrons and holes may be respectively moved to electrodes, thereby making the electrical signal. In particular, a germanium (Ge) light detector, which is easily integrated on silicon, may be spotlighted. Mobility of electrons and/or holes in germanium may be greater than mobility of electrons and/or holes in silicon, and/or the generated carriers (i.e. electrons and holes) in the germanium light detector may be quickly acquired. Therefore, the germanium light detector may have advantages of great bandwidth and improved quantum efficiency.

SUMMARY

Embodiments of the inventive concept may provide light detection devices having advantages of low manufacture cost, process time reduction, and mass production.

Embodiments of the inventive concept may provide methods of manufacturing light detection devices having advantages of low manufacture cost, process time reduction, and mass production.

According to example embodiments of the inventive concepts, a semiconductor device includes: a first conductive pattern on a surface of a substrate; an insulating pattern on the substrate, the insulating pattern having an opening exposing at least a portion of the first conductive pattern; a light absorbing layer filling the opening of the insulating pattern, the light absorbing layer having a top surface disposed at a level higher than a top surface of the insulating pattern; a second conductive pattern on the light absorbing layer; and connecting terminals electrically connected to the first and second conductive patterns, respectively.

According to example embodiments of the inventive concepts, a method of fabricating a semiconductor device includes: providing dopants of a first conductivity type to a surface region of a substrate to form a first conductive pattern; forming an insulating pattern on the substrate, the insulating pattern including an opening exposing at least a portion of the first conductive pattern; forming a light absorbing layer filling the opening, the light absorbing layer grown from the first conductive pattern exposed by the opening and having a top surface disposed at a level higher than a top surface of the insulating pattern; forming a second conductive pattern on the light absorbing layer; and forming connecting terminals electrically connected to the first and second conductive patterns, respectively.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
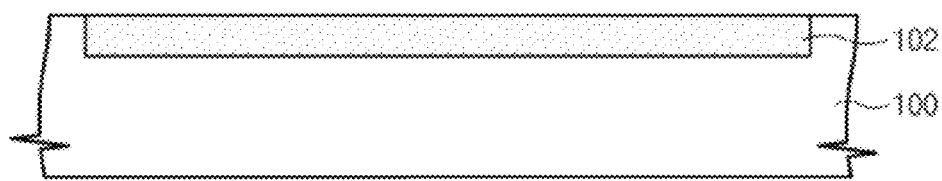
FIGS. 1 through 7 are cross sectional views illustrating methods of manufacturing light detection devices according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept.

Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIGS. 1 through 7 are cross sectional views illustrating methods of manufacturing light detection devices according to some embodiments of the inventive concept.

Referring to FIG. 1, a first conductive pattern 102 may be formed at a substrate 100.

The substrate 100 may be a silicon substrate or a silicon-on-insulator (SOI) substrate. Dopants of a first conductivity type may be provided into the substrate 100. The first conductivity type may be an N type or a P type. The dopants of the first conductivity type may be injected into a surface region of the substrate 100 through an ion implantation process, and then the injected dopants may be diffused to form the first conductive pattern 102 on the surface of the substrate 100.

Figure 2:
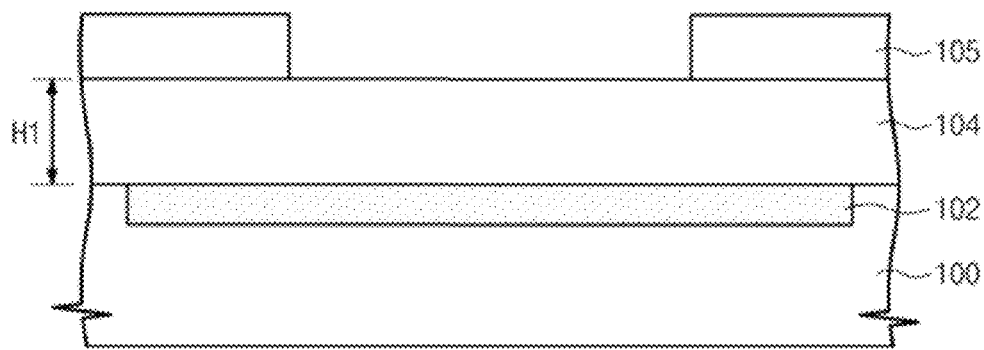

Referring to FIG. 2, an insulating layer 104 and a mask 105 may be sequentially formed on the substrate 100 which the first conductive pattern 102 is formed on.

The insulating layer 104 may include oxide, nitride and/or oxynitride. In an embodiment, the insulating layer 104 may be formed with a first height H1.

The mask 105 may include a material having an etch selectivity with respect to the insulating layer 104. For example, when the insulating layer 104 includes oxide, the mask 105 may include nitride. The mask 105 may have a mask-opening which exposes a portion of the insulating layer 104.

Figure 3A:
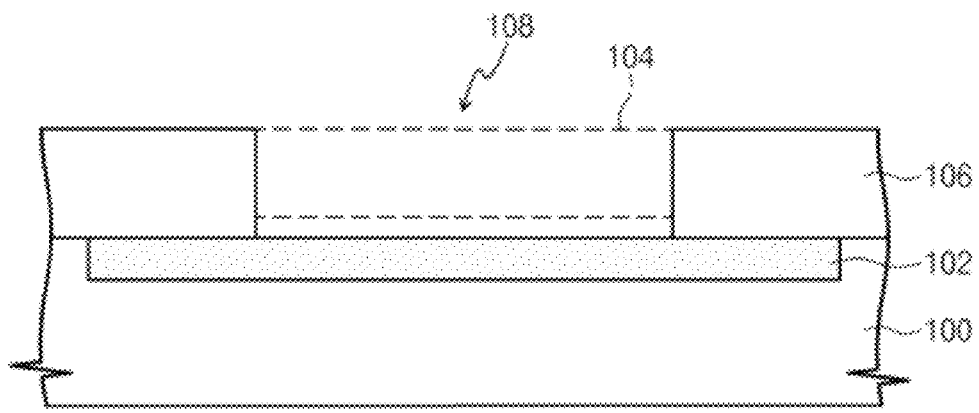
Figure 3B:
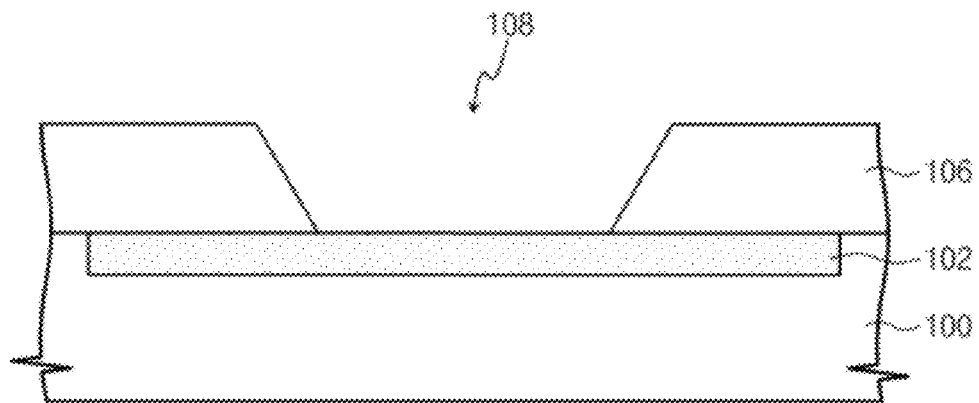

Referring to FIGS. 3A and 3B, the insulating layer 104 may be etched by an etch process using the mask 105 to form an insulating pattern 106.

According to some embodiments of the inventive concept, the insulating layer 104 exposed by the mask layer 105 may be etched through a first etch process being a dry etch process. The exposed insulating layer 104 may be partially etched by the dry etch process. That is, after performing the dry etch process, a portion of the exposed insulating layer 104 may remain. The remaining portion of the exposed insulating layer 104 may be etched through a second etch process being a wet etch process. The insulating layer 104 exposed by the mask 105 may be completely etched by the second etch process. Since the insulating layer 104 exposed by the mask 105 may completely etched, the insulating pattern 106 having an opening 108 may be formed. At least a portion of the first conductive pattern 102 may be exposed by the opening 108.

As described above, since the insulating layer 104 exposed by the mask 105 may be etched using the dry etch process and the wet etch process, etching damage of the first conductive pattern 102 and/or the substrate 100 caused by a dry etch process may be prevented. Thus, defects of subsequent processes may be minimized.

According to an embodiment, as illustrated in FIG. 3A, a side surface of the insulating pattern 106, which is exposed by the opening 108, may be substantially perpendicular to a top surface of the substrate 100. Thus, an upper portion of the opening 108 may have substantially the same width as a lower portion of the opening 108. According to other embodiment, as illustrated in FIG. 3B, a width of the insulating pattern 106 may be gradually widened as it becomes closer to substrate 100. Thus, a width of the opening 108 of the insulating pattern 106 may be gradually narrowed as it becomes closer to substrate 100. That is, the opening 108 of the insulating pattern 106 may be downwardly tapered.

After forming the insulating pattern 106, the mask 105 may be removed from the insulating pattern 106.

Figure 4:
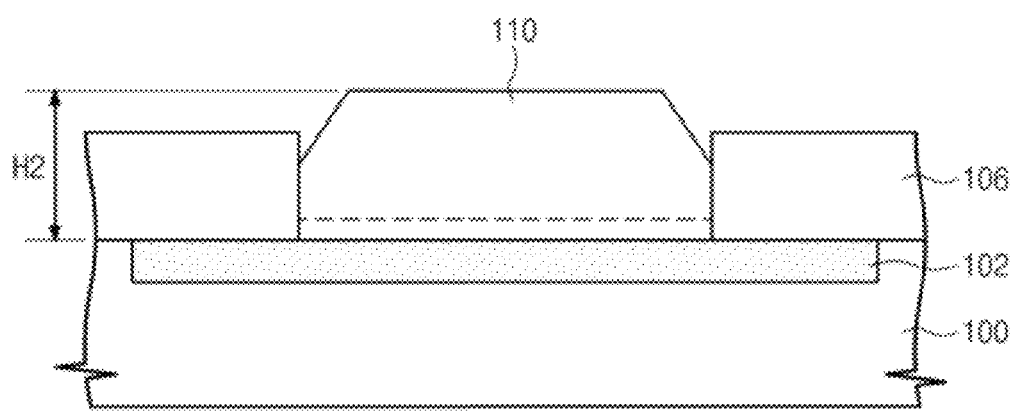

Referring to FIG. 4, a light absorbing layer 110 may be formed to fill the opening 108 which exposes the first conductive pattern 102.

The light absorbing layer 110 may have a second height H2 being substantially higher than the first height H1. Also, the light absorbing layer 110 may include a lower portion and an upper portion. The lower portion of the light absorbing layer 110 may be disposed in the opening 108 of the insulating pattern 106, and may have a structure corresponding to a shape of the opening 108. The upper portion of the light absorbing layer 110 may be upwardly extended from the lower portion of the light absorbing layer 110. The upper portion of the light absorbing layer 110 may be upwardly tapered. That is, a width of the upper portion of the light absorbing layer 110 may be reduced as it becomes closer to a top surface of the light absorbing layer 110. The top surface of the light absorbing layer 110 may be flat, so that the upper portion of the light absorbing layer 110 may have a mesa structure. The top surface of the light absorbing layer 110 may be disposed at a level substantially higher than a top surface of the insulating pattern 106 with respect to the top surface of the substrate 100.

The light absorbing layer 110 may include single crystal germanium. In embodiments, the light absorbing layer 110 may selectively grow from the first conductive pattern 102 exposed by the first conductive pattern 102. In more detail, the light absorbing layer 110 may be formed using a reduced pressure chemical vapor deposition (RPCVD) process or an ultra-high vacuum chemical vapor deposition (UHVCVD) process.

According to an embodiment of the inventive concept, the light absorbing layer 110 may be formed by a first growth process and a second growth process. The first growth process may be performed at a first temperature, and the second growth process may be performed at a second temperature substantially higher than the first temperature. The first growth process may be performed using a source including germanium and hydrogen at a process temperature within the range of about 300 degrees Celsius to about 500 degrees Celsius and at a process pressure of tens Torr. For example, the source may be a mixture gas of germanium hydride ($GeH_4$) and hydrogen. The mixture gas may be formed by diluting the hydrogen gas with the germanium hydride. The content rate of the germanium hydride in the mixture gas may have the range of about 5% to about 30%. A carrier gas of the first growth process may be a hydrogen gas. A flow rate of the source may have the range of about 50 sccm (standard cubic centimeters per minute) to about 200 sccm, and a flow rate of the carrier gas may have the range of about 5 slm (standard litters per minute) to about 50 slm. A thickness of a portion of the light absorbing layer 110 formed by the first growth process may have the range of about 30 nanometers to about 300 nanometers. The second growth process may be performed at a process temperature within the range of about 500 degrees Celsius to about 800 degrees Celsius and at a process pressure of tens Torr. A source and a carrier gas of the second growth process may be substantially the same as the source and the carrier gas of the first growth process. For example, the source of the second growth process may be a mixture gas of germanium hydride ($GeH_4$) and hydrogen. The carrier gas of the second growth process may use a hydrogen gas. A flow rate of the source of the second growth process may have the range of about 10 sccm to about 100 sccm, and a flow rate of the carrier gas of the second growth process may have the range of about 5 slm to about 50 slm. A thickness of a portion of the light absorbing layer 110 formed by the second growth process may have the range of about 500 nanometers to about 5000 nanometers. According to embodiments of the inventive concept, the first and second growth processes for forming the light absorbing layer 110 may be performed within the same chamber. That is, the first and second growth processes may be performed in-situ.

A growth rate of the selective growth of the light absorbing layer 110 including single crystal germanium on the first conductive pattern 102 may be substantially higher than a growth rate of a bulk germanium. Thus, a process time and/or consumption of the source may be reduced. Also, the light absorbing layer 110 may be formed using the RPCVD process or the UHVCVD process suitable for mass production. As a result, low manufacture cost and/or the mass production of the light detection device may be realized.

Additionally, various problems caused by a conventional method may be reduced or prevented. In a conventional method, after forming a single crystal germanium layer, the single crystal germanium layer may be patterned by a dry etching process to form a light absorber. The conventional method may cause various problems. For example, the thick single crystal germanium layer formed by the conventional method may be unevenly etched, and/or metal may remain on a sidewall of the single crystal germanium layer during formation of a metal interconnection. However, according to embodiments of the inventive concept, the light absorbing layer 110 may be formed by the selective growth including the first and second growth process. Thus, various problems caused by the conventional method may be reduced or prevented.

Figure 5:
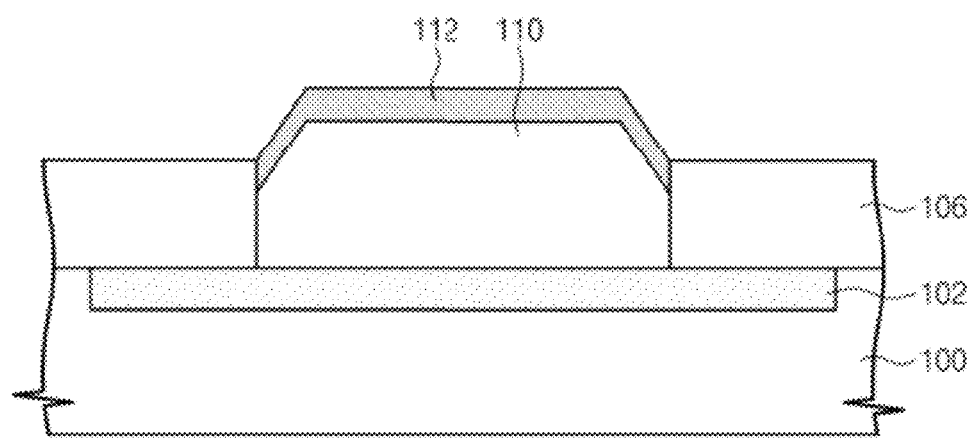

Referring to FIG. 5, a second conductive pattern 112 may be formed on the light absorbing layer 110.

In embodiments, the second conductive pattern 112 may be selectively grown on an exposed surface of the light absorbing layer 110. The exposed surface of the light absorbing layer 110 may include the top surface of the light absorbing layer 110. In more detail, the second conductive pattern 112 may be selectively formed on the exposed surface of the light absorbing layer 110 by a RPCVD process or a UHVCVD process.

In embodiments, the second conductive pattern 112 may include polycrystalline silicon doped with dopants of a second conductivity type. The second conductive pattern 112 may be formed using a silicon source at a process temperature within the range of about 500 degrees Celsius to about 900 degrees Celsius and at a process pressure of tens Torr. For example, the silicon source may use silane ($SiH_4$), dichlorosilane ($SiH_4Cl_2$) and/or silicon chloride ($SiCl_4$), being refined to high purity, and a hydrogen gas may be used as carrier gas. A flow rate of the silicon source may have the range of about 50 sccm to about 500 sccm, and a flow rate of the carrier gas may have the range of about 5 slm to about 50 slm. A thickness of the second conductive pattern 112 may have the range of about 50 nanometers to about 300 nanometers. During formation of the second conductive pattern 112, the dopants of the second conductivity type may be provided in the chamber in which the second conductive pattern 112 is formed. That is, the second conductive pattern 112 may be doped in-situ. The second conductive pattern 112 may include the dopants of the second conductivity type different from the first conductivity type. For example, when the first conductivity type is the P type, the second conductivity type may be the N type. When the second conductivity type is the N type, phosphine ($PH_3$) may be injected into the chamber during performing the RPCVD process or the UHVCVD process. Alternatively, when the first conductivity type is the N type, the second conductivity type may be the P type. When the second conductivity type is the P type, diborane ($B_2H_6$) may be injected in the chamber during the RPCVD process or the UHVCVD process.

In other embodiments, the second conductive pattern 112 may include polycrystalline silicon-germanium. In more detail, the second conductive pattern 112 may be formed using a source including silicon and germanium at a process temperature within the range of about 500 degrees Celsius to about 900 degrees Celsius and at a process pressure of tens Torr. For example, the source may include silane ($SiH_4$), germane ($GeH_4$), hydrochloric acid (HCl) and hydrogen. A hydrogen gas may be used as carrier gas. A flow rate of the source may have the range of about 50 sccm to about 500 sccm, and a flow rate of the carrier gas may have the range of about 5 slm to about 50 slm. A thickness of the second conductive pattern 112 may have the range of about 50 nanometers to about 300 nanometers. During formation of the second conductive pattern 112, the dopants of the second conductivity type may be provided in the chamber.

The formation process of the light absorbing layer 110 and the formation process of the second conductive pattern 112 may be performed in the same chamber. That it, the formation processes of the light absorbing layer 110 the second conductive pattern 112 may be performed in-situ.

In other embodiments, since the light absorbing layer 110 and the second conductive pattern 112 may be formed by the RPCVD process, the light absorbing layer 110 and the second conductive pattern 112 may have a threading dislocation density substantially lower than a layer formed by another chemical vapor deposition process.

Figure 6:
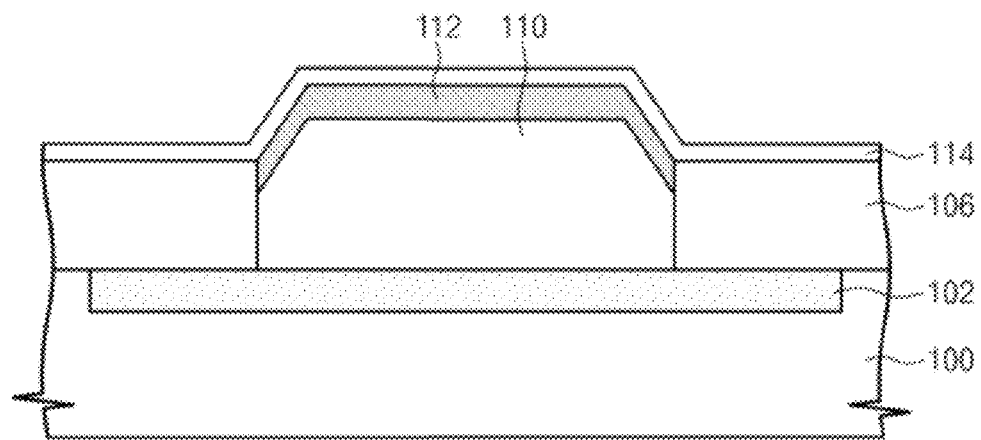

Referring to FIG. 6, a protecting layer 114 may be conformally formed on the insulating pattern 106 and the second conductive pattern 112.

The protecting layer 114 may be continuously disposed along a profile of morphology of the insulating pattern 106 and the second conductive pattern 112. The protecting layer 114 may include oxide, nitride and/or oxynitride.

Figure 7:
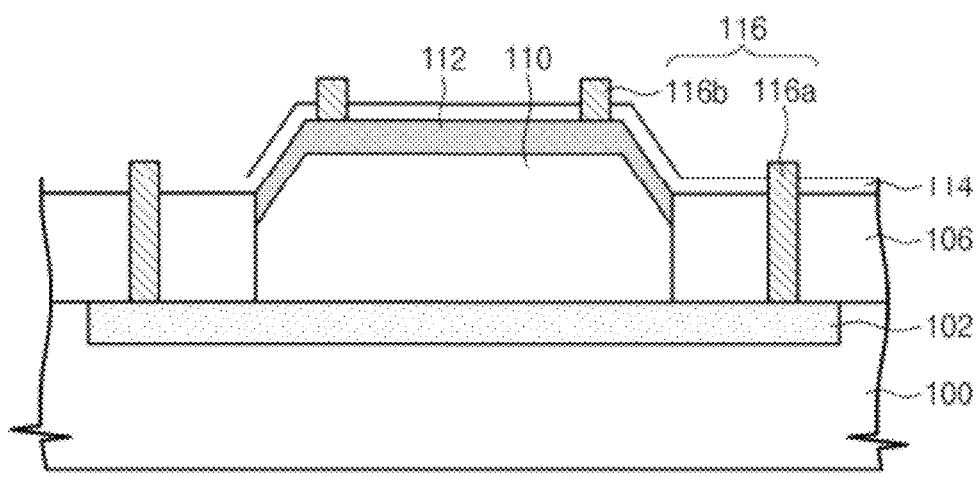

Referring to FIG. 7, connecting terminals 116 may be formed. The connecting terminals 116 may be electrically connected to the first and second conductive patterns 102 and 112, respectively.

The connecting terminals 116 may include a first connecting terminal 116a electrically connected to the first conductive pattern 102, and a second connecting terminal 116b electrically connected to the second conductive pattern 112. The first connecting terminal 116a may sequentially penetrate the protecting layer 114 and the insulating pattern 106 to be electrically connected to the first conductive pattern 102. The second connecting terminal 116b may penetrate the protecting layer 114 to be electrically connected to the second conductive pattern 112.

In present embodiment, as illustrated in FIG. 7, each of the first and second connecting terminals 116a and 116b may be two. However, the inventive concept is not limited to the number of the first and second connecting terminals 116a and 116b.

The protecting layer 114 and/or the insulating pattern 106 may be selectively etched to form holes exposing top surfaces of the first and second conductive patterns 102 and 112. A conductive material filling each of the holes may be formed. The conductive material may include metal and/or metal compound. For example, the conductive material may include one of aluminum (Al), copper (Cu), titanium (Ti), titanium nitride (TiN), platinum (Pt), tantalum (Ta) and combination thereof. Subsequently, a thermal treatment process may be performed, so that the conductive material may be partially transformed into a silicide. In more detail, the first and second conductive pattern 102 and 112 may include a semiconductor material including silicon and/or germanium, the conductive material in the hole may include metal and/or metal compound. An interface between the conductive patterns 102 and 112, and the conductive material in the hole may be transformed into silicide, thereby reducing a contact resistance between the conductive patterns 102 and 112, and the connecting terminals 116.

Therefore, the light detection device may be formed. The light detection device may include the first conductive pattern 102 formed on the surface of the substrate 100, the insulating pattern 106 disposed on the substrate 100 and including the opening 108 exposing the at least a portion of the first conductive pattern 102, the light absorbing layer 110 filling the opening 108 and having the top surface disposed at a level higher than the top surface of the insulating pattern 106, the second conductive pattern 112 on the light absorbing layer 110, and the connection terminals 116 electrically connected to the first and second conductive patterns 102 and 112.

Figure 8:
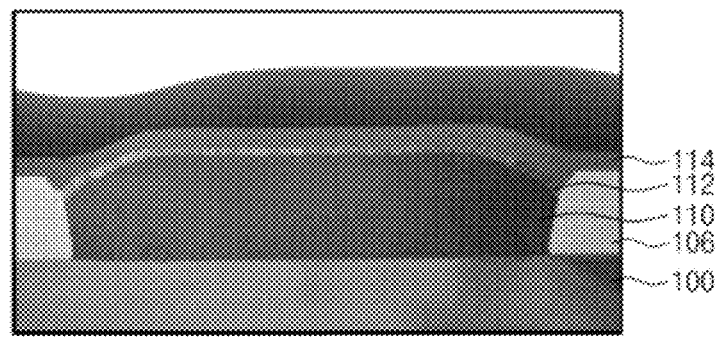
FIG. 8 is a transmission electron microscope (TEM) photograph showing a light detection device according to some embodiments of the inventive concept.

FIG. 8 is a transmission electron microscope (TEM) photograph showing a light detection device according to some embodiments of the inventive concept.

As illustrated in FIG. 8, the light absorbing layer 110 and the second conductive pattern 112 did not grow on the insulating pattern 106, but the light absorbing layer 100 and the second conductive pattern 112 grew on the first conductive pattern 102 exposed by the opening 108 of the insulating pattern 106. Also, each of the light absorbing layer 110 and the second conductive pattern 112 was formed to have a smooth surface.

According to embodiments of the inventive concept, the light absorbing layer self-aligned with the first conductive pattern may be formed using the insulating pattern without additional pattern. Therefore, the manufacturing process may be simple. As a result, the process time and/or manufacture cost may be reduced, and/or efficiency of mass production of the light detection devices may be increased.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A light detection device comprising:
   a silicon substrate;
   a first conductive pattern formed in a top surface of the silicon substrate using dopants provided into the silicon substrate, the first conductive pattern having a top surface;
   an insulating pattern on the top surface of the silicon substrate and on a first portion of the top surface of the first conductive pattern, the insulating pattern having an opening exposing a second portion of the top surface of the first conductive pattern;
   a light absorbing layer filling the opening of the insulating pattern, the light absorbing layer being formed on the second portion of the top surface of the first conductive pattern, the light absorbing layer having a top surface disposed at a height substantially higher than a height of a top surface of the insulating pattern;
   a second conductive pattern on the light absorbing layer;
   a first connecting terminal electrically connected to the first conductive pattern; and
   a second connecting terminal electrically connected to the second conductive pattern.

2. The light detection device of claim 1, wherein the light absorbing layer comprises:
   a lower portion in the opening, the lower portion having a structure corresponding to a shape of the opening; and
   an upper portion upwardly extended from the lower portion, the upper portion being upwardly tapered so that a width of the upper portion is reduced as the width becomes closer to the top surface of the light absorbing surface, and having a flat top surface.

3. The light detection device of claim 1, wherein a side surface of the opening of the insulating pattern is substantially perpendicular to the top surface of the substrate.

4. The light detection device of claim 1, wherein the opening defined by the insulating pattern becomes wider toward a top end of the opening.

5. The light detection device of claim 1, wherein the first conductive pattern includes dopants of a first conductivity type,
   the light absorbing layer includes single crystal germanium, and
   the second conductive pattern includes dopants of a second conductivity type different from the first conductivity type.

6. The light detection device of claim 1, wherein the second conductive pattern has a structure corresponding to a surface profile of an upper portion of the light absorbing layer.

7. The light detection device of claim 1, wherein
   the first connecting terminal penetrates the insulating pattern to be electrically connected to the first conductive pattern.

8. The light detection device of claim 1, wherein the first conductive pattern extends into the silicon substrate.

9. The light detection device of claim 8, wherein the top surface of the first conductive pattern is coplanar with the top surface of the silicon substrate.

10. The light detection device of claim 1, wherein the top surface of the first conductive pattern is lower than the top surface of the insulating pattern.

* * * * *